(12) United States Patent
Lin et al.

(10) Patent No.: US 9,324,697 B1
(45) Date of Patent: Apr. 26, 2016

(54) CHIP-ON-HEATSINK LIGHT EMITTING DIODE PACKAGE AND FABRICATION METHOD

(71) Applicant: Toshiba Corporation, Minato-ku, Tokyo (JP)

(72) Inventors: Chao-Kun Lin, San Jose, CA (US); Norihito Hamaguchi, Morgan Hill, CA (US)

(73) Assignee: Toshiba Corporation, Tokyo (JP)

( * ) Notice: Subject to any disclaimer, the term of this patent is extended or adjusted under 35 U.S.C. 154(b) by 0 days.

(21) Appl. No.: 14/659,029

(22) Filed: Mar. 16, 2015

(51) Int. Cl.
| | |
|---|---|
| *H01L 33/00* | (2010.01) |
| *H01L 29/24* | (2006.01) |
| *H01L 31/0203* | (2014.01) |
| *H01L 21/00* | (2006.01) |
| *H01L 25/16* | (2006.01) |
| *H01L 33/48* | (2010.01) |
| *H01L 33/62* | (2010.01) |
| *H01L 33/64* | (2010.01) |
| *H01L 33/56* | (2010.01) |
| *H01L 33/54* | (2010.01) |
| *H01L 33/50* | (2010.01) |
| *H01L 29/861* | (2006.01) |

(52) U.S. Cl.
CPC ............ *H01L 25/167* (2013.01); *H01L 29/861* (2013.01); *H01L 33/0095* (2013.01); *H01L 33/483* (2013.01); *H01L 33/505* (2013.01); *H01L 33/54* (2013.01); *H01L 33/56* (2013.01); *H01L 33/62* (2013.01); *H01L 33/642* (2013.01); *H01L 2933/005* (2013.01); *H01L 2933/0033* (2013.01); *H01L 2933/0041* (2013.01); *H01L 2933/0066* (2013.01)

(58) Field of Classification Search
CPC . H01L 25/167; H01L 25/0753; H01L 31/173; H01L 33/62; H01L 27/1214; H01L 27/14643; H01L 27/14627; H01L 27/14685; H01L 27/14618; H01L 27/14689; H01L 33/0079; H01L 2924/01079; H01L 2924/14
USPC .......... 257/80, 100, 431–433; 438/26, 29, 51, 438/57, 106, 127
See application file for complete search history.

(56) References Cited

U.S. PATENT DOCUMENTS

| | | | |
|---|---|---|---|
| 7,202,107 B2 | 4/2007 | Fuergut et al. | |
| 2011/0298002 A1* | 12/2011 | Takeuchi | H01L 33/641 257/99 |

* cited by examiner

*Primary Examiner* — Hsien Ming Lee
(74) *Attorney, Agent, or Firm* — White & Case LLP (57) ABSTRACT

The present disclosure provides a novel light-emitting diode package and corresponding fabrication method for making such a package. The novel LED package comprises a resin carrier layer having a first and second surface. Embedded in the resin carrier layer are at least one electrical conductor and at least one LED. The embedded LED comprises a substrate having a bottom surface that is substantially exposed at the second surface of the resin carrier layer. The embedded LED further comprises a light emitting layer that is substantially exposed at the first surface of the resin carrier layer.

12 Claims, 11 Drawing Sheets

CHIP-ON-HEATSINK LIGHT EMITTING DIODE PACKAGE AND FABRICATION METHOD

FIELD OF THE INVENTION

The present invention relates to a novel light-emitting diode (LED) package and the fabrication method for making such a structure.

BACKGROUND OF THE INVENTION

LED packages serve important functions for LED chips. For example, the LED packages protect the LED chips from the environment, and allow the LED chips to interface electrically and thermally with printed circuit boards. Furthermore, LED packages provide mechanical support, provide the appropriate electrical connections, assist with heat dissipation, and enhance the light emission efficiency from the LED chip.

Figure 1:
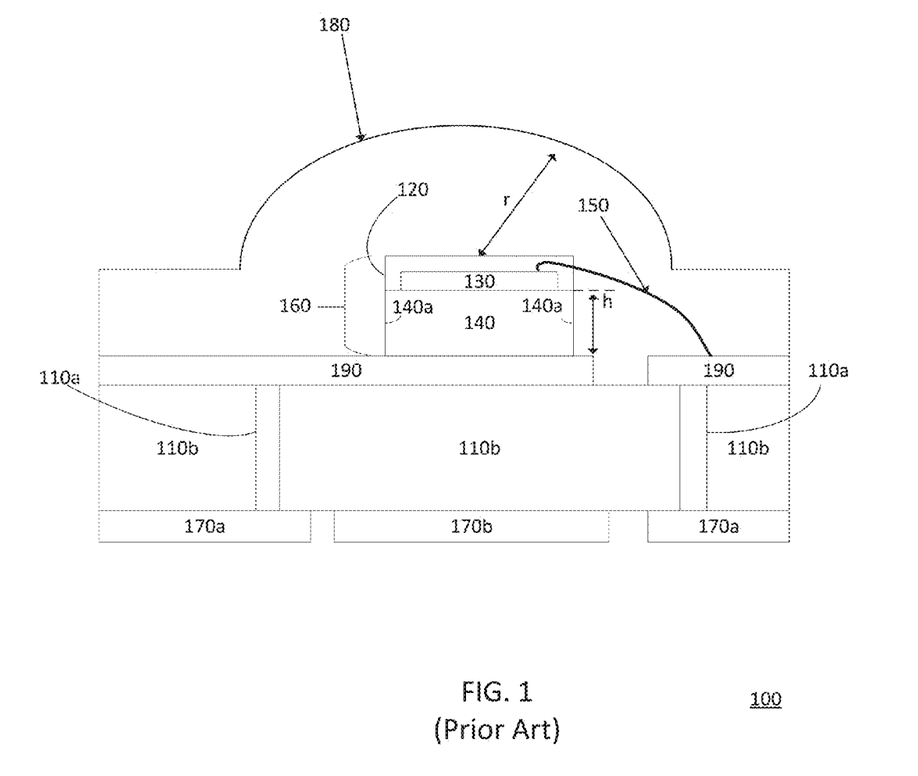
FIG. 1 provides a cross-sectional view of a conventional LED package.

FIG. 1 illustrates a conventional LED package 100. The package 100 consists of a LED die 160 attached to a ceramic substrate 110*b* (e.g., AlN or Al2O3) via a top electrode 190. The LED die 160, which comprises a LED substrate 140, a light emitting layer 130, and a phosphor layer 120, is conventionally attached to the LED substrate 140 with die-attach epoxy or solder (not shown). The light emitting layer 130 comprises a p-type layer, an active layer and an n-type layer. After the LED die 160 is attached to the substrate 110*b*, a separate process is required to attach a bond wire 150 which electrically connects the LED die 160 to the top electrode 190 on the substrate 110*b*. There are electrical conducting vias 110*a* built into the ceramic substrate 110*b* to connect the top electrode 190 and electrical contact pads 170*a* and thermal pad 170*b*. Thermal pad 170*b* facilitates heat dissipation from the LED package 100 to a heat-sink (not shown). Finally, a molded silicone dome 180 is formed on top of the LED die 160. A completed conventional LED package 100 is then ready for use and surface-mountable to printed circuit boards or a heat-sink.

One issue with a conventional LED package such as the one shown in FIG. 1 is the cost associated with using die-level processing and packaging techniques to fabricate the LED package. The U.S. Department of Energy published a report—Bardsley et al., "Manufacturing Roadmap—Solid State Lighting Research and Development" (August 2014)—which is incorporated herein by reference. The report breaks down various LED Cost Drivers for high-power LED packages and concluded that a majority of the costs are attributable to packaging costs associated with die-level processing (i.e., the costs associated with performing steps on each die on the wafer). According to the report, these packaging costs account for 61% of the total cost for high-power LED packages, with costs for performing wafer level processing and the materials for the substrate, epitaxy, and phosphor making up for the remainder of the total cost of the LED package. Forecasting ahead, the report predicted that the figure for high-power LED packages is only expected to drop to 54% of the total cost for high-power LED packages by 2020.

With most of the costs for manufacturing conventional LED packages tied to die-level processes, the report suggested that cost savings could be achieved by performing more of the packaging processes at the wafer level. Wafer-level processing of an LED package refers to packaging the LED while it is still part of the wafer; in contrast, die-level processing acts on each LED package individually.

As such, the report recognized the long-felt need for an improvement to conventional LED packages and their respective fabrication methods by performing packaging activities at a wafer level in order to reduce the costs for LED packages.

Another issue with the conventional LED package 100 is the exposure of the sidewalls 140*a* of LED substrate 140 when a LED with an absorbing substrate is used in the package. This amount of the exposed sidewalls 140*a* is determined by the height, h, of the LED die 160. The exposed sidewalls 140*a* compromise the efficiency of the LED package 100 because they absorb light emitted from the light emitting layer 130 when light is reflected within the silicone dome 180. To prevent the sidewalls 140*a* from absorbing light and thereby improve efficiency of light output, applying a reflective coating (not shown) to cover the sidewalls 140*a* of the LED substrate 140 is preferable.

Prior methods of replacing common semiconductor wafers with a "reconstituted" semiconductor wafer are well known. For example, Fuerget et al., U.S. Pat. No. 7,202,107, which is hereby incorporated by reference, discloses the concept of embedding semiconductor chips onto a plastic compound and forming the semiconductor component from the embedded chips. However, due to the difficulties in the manufacturing process, such a technique has never been applied in the manufacture of LED packages.

Accordingly, there remain long-felt needs to reduce the costs of producing LED packages and to improve the efficiency of the light output of LED packages.

BRIEF DESCRIPTION OF THE INVENTION

In one embodiment, a novel LED package comprises a resin carrier layer having a first and second surface. Embedded in the resin carrier layer are at least one electrical conductor and at least one LED. The embedded LED comprises a substrate having a bottom surface that is substantially exposed at the second surface of the resin carrier layer. The embedded LED further comprises a light emitting layer that is substantially exposed at the first surface of the resin carrier layer.

In another embodiment, there is a fabrication method for making the novel LED package described above. The fabrication method may include an initial step of arranging at least one LED and at least one electrical conductor on a carrier wafer with adhesive foil wherein the light emitting layer of the at least one LED is in contact with the adhesive foil. The next step may comprise applying an epoxy molding compound over at least one LED, at least one conductor, and the carrier wafer, where the at least one LED comprises a substrate and a light emitting layer located on a top surface of the substrate. The at least one LED may be considered to be substantially embedded in the epoxy molding compound. After applying the epoxy molding compound, the method may continue by removing the carrier wafer from a second surface of the epoxy molding compound. By way of this step, a top surface of the light emitting layer and a top surface of the at least one conductor are exposed at a first surface of the epoxy molding compound. Then, a portion of a second surface of the epoxy molding compound may be removed, wherein a bottom surface of the substrate and a bottom surface of the at least one conductor are exposed at the second surface of the epoxy molding compound.

DETAILED DESCRIPTION OF THE INVENTION

A novel LED package and a fabrication method for making such a package will now be described more fully with reference to the accompanying drawings. The drawings are not necessarily drawn to scale and certain features of the disclosure may be shown exaggerated in scale or in schematic form in the interest of clarity and conciseness.

In describing various embodiments, specific terminology is employed for the sake of clarity. However, the disclosure is not intended to be limited to the specific terminology used in this specification. It is to be understood that each specific element includes all technical equivalents which operate in a similar manner to accomplish a similar purpose.

Figure 2A:
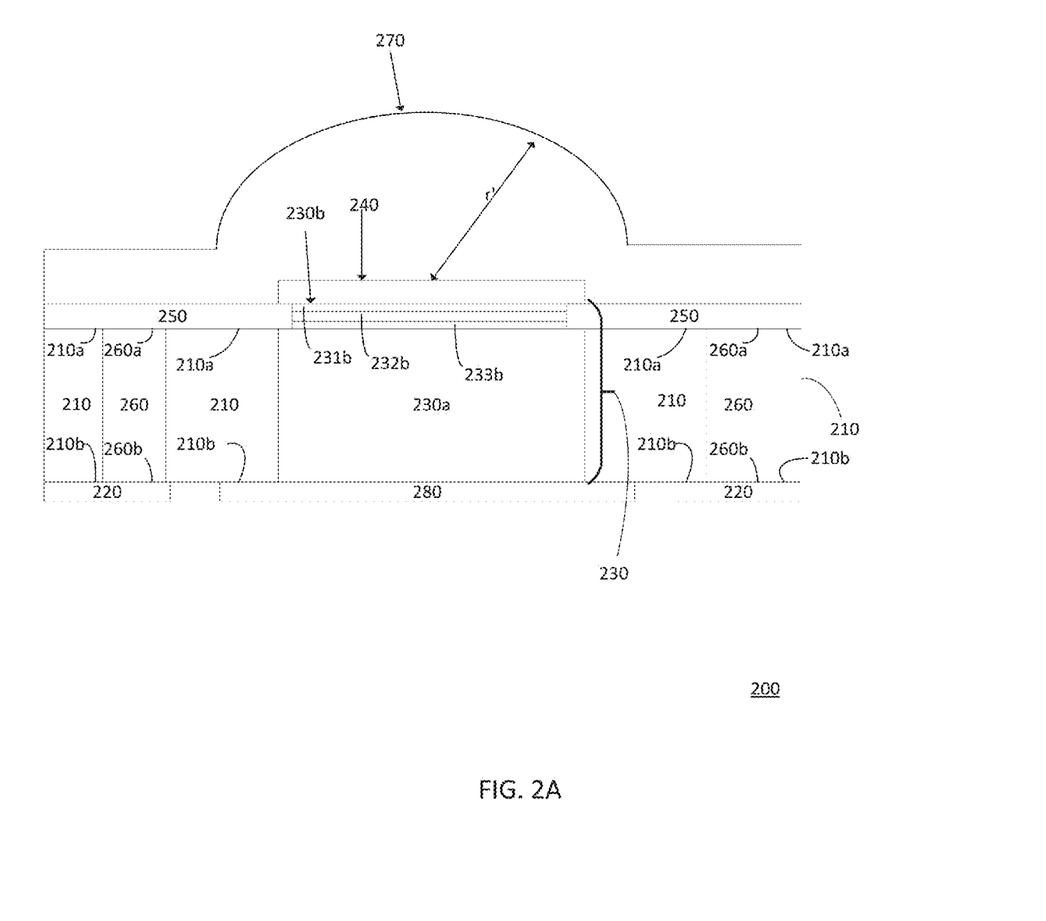
FIG. 2A provides a cross-sectional view of an LED package according to one embodiment of the present disclosure.
Figure 2B:
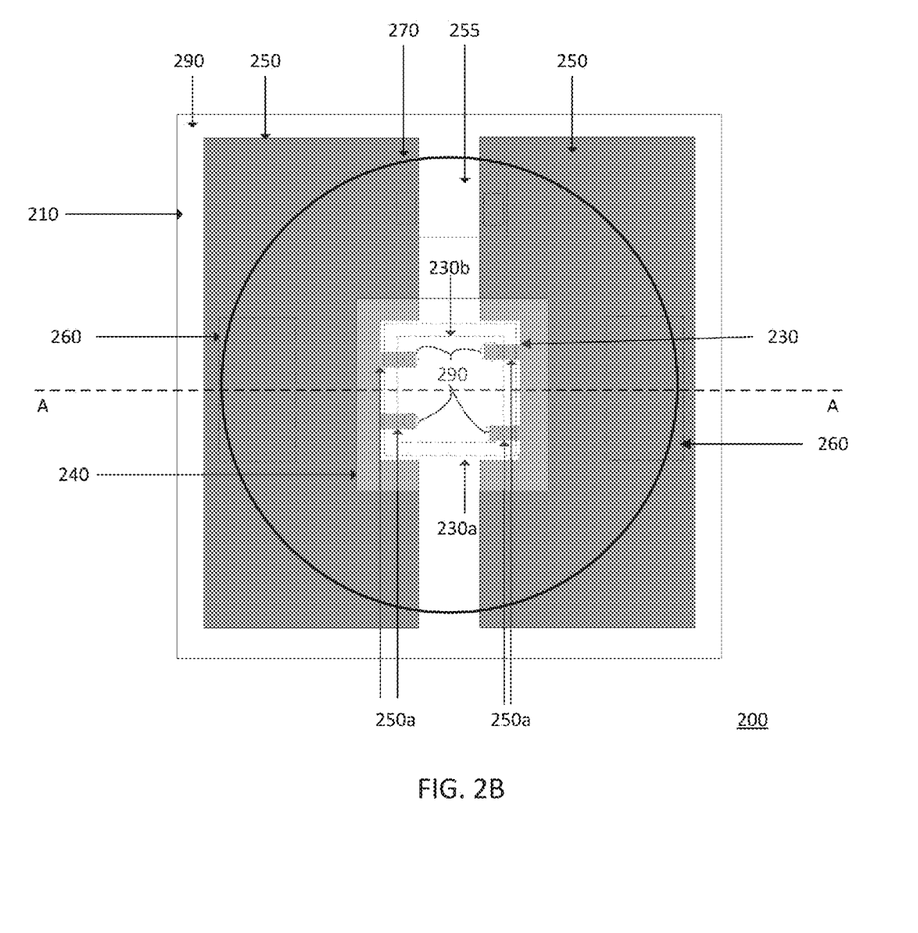
FIG. 2B provides a plan view of the LED package of FIG. 2A.

FIG. 2A is a section view of an LED package 200 taken along axis AA shown in FIG. 2B according to one embodiment of the present disclosure. The LED package 200 comprises a resin carrier layer 210 having a first surface and a second surface. The first and second surfaces are opposing surfaces of the resin carrier layer 210. For example, the first surface maybe the top surface of the resin carrier layer 210 and the second surface may then be the bottom surface of the resin carrier layer 210. The resin carrier layer 210 may be comprised of, for example, an epoxy molding compound. The LED package 200 further comprises an LED die 230, which may comprise at least a light emitting layer 230b and a LED substrate 230a, and electrical conductors 260, which are substantially embedded within the resin carrier layer 210.

The LED die 230 may be substantially embedded within the resin carrier layer 210 by, for example, substantially embedding the LED substrate 230a of the LED die 230 within a resin carrier layer 210 while at least the top surface of the light emitting layer 230b of the LED die 230 remains exposed at the first surface of the resin carrier layer 210. Thus, a phosphor layer 240 may then be formed on the exposed top surface of the light emitting layer 230b.

While the LED substrate 230a is substantially embedded within the resin carrier 210, the bottom surface of the LED substrate 230a remains exposed at a second surface (opposite the first surface) of the resin carrier layer 210. The LED die 230 may be substantially embedded in the resin carrier layer 210 in any of the following manners as long as the top surface of the light emitting layer 230b and the bottom surface of the LED substrate 230a are exposed at the first and second surfaces of the resin carrier layer, respectively. In one embodiment, the LED substrate 230a of the LED die 230 can have substantially the same thickness as the resin carrier layer 210. In another embodiment, the top surface of the LED die 230 can also be considered to be substantially planar with the first surface of resin carrier layer 210. Furthermore, one of ordinary skill in the art would understand that an LED die 230 that is "substantially embedded" means that at least 50% of the sidewalls of the LED die 230 are embedded within the resin carrier layer. This statement only clarifies the meaning of the phrase "substantially embedded" and in no limits the meaning of the term "substantially."

Referring back to the light emitting layer 230b, it may comprise an n-type layer 231b, an active layer 232b and a p-type layer 233b. Redistribution layer (RDL) 250 may also be formed on the first surface of the resin carrier layer 210. The RDL 250 may comprise metal interconnects and functions to electrically connect the light emitting layer 230b and the electrical conductors 260.

While embedded within the resin carrier layer 210, both a top surface 260a and bottom surface 260b of the electrical conductors 260 are exposed at the first surface 210a and second surfaces 210b of the resin carrier layer 210, respectively. The bottom surfaces 260b of the electrical conductors 260 are exposed at the second surface 210b of the resin carrier layer 210 and are directly connected to electrical contact pads 220. The top surfaces 260a of the electrical conductors 260 are exposed at the first surface 210a of the resin carrier layer 210 and are directly connected to RDL 250. The electrical conductors 260 may be doped semiconductors (e.g. silicon), metal (e.g. copper), or another suitable conductive material. The electrical conductors 260 may be formed by drilling through the resin carrier layer 210 to create resin-carrier vias, into which electrical plating metallic material may be deposited.

Referring back to the LED die 230, a bottom side of the LED substrate 230a is exposed at the second surface of the resin carrier layer 210. This exposed side of the LED substrate 230a may then be directly in contact with a thermal contact pad 280. Also embedded (but not visible in the view provided by FIG. 2A) in the resin carrier layer 210 is an electrostatic discharge (ESD) protection diode which serves to protect the LED package 200 from electrostatic discharge events. FIG. 2B shows a Zener diode which can be used as the ESD protection diode.

FIG. 2B is a plan view of LED package 200. According to an embodiment, instead of bond wires as used by conventional LED packages, the LED package 200 may have the RDL 250 formed on the first surface of the resin carrier layer 210. Forming the RDL 250 on the first surface of the resin carrier layer 210 may also include depositing reflective metal or other reflective materials on a top surface of the RDL 250. The purpose of the reflective metal is to minimize the LED package's 200 optical absorption of light emitted by the light emitting layer 230b. The deposition of reflective metal on RDL 250 therefore allows the RDL 250 to (1) provide metal interconnects 250a which in turn provides electrical connections and (2) reflects photons (i.e., preventing the absorption of light). Through its metal interconnects, the RDL 250 electrically connects the light emitting layer 230b of the LED die 230 to the embedded electrical conductors 260. More particularly, the RDL 250 connects to the light emitting layer 230b through metal interconnects 250a that extend from RDL 250, and are in contact with contacts 290 located on the light emitting layer 230b.

Figure 2C:
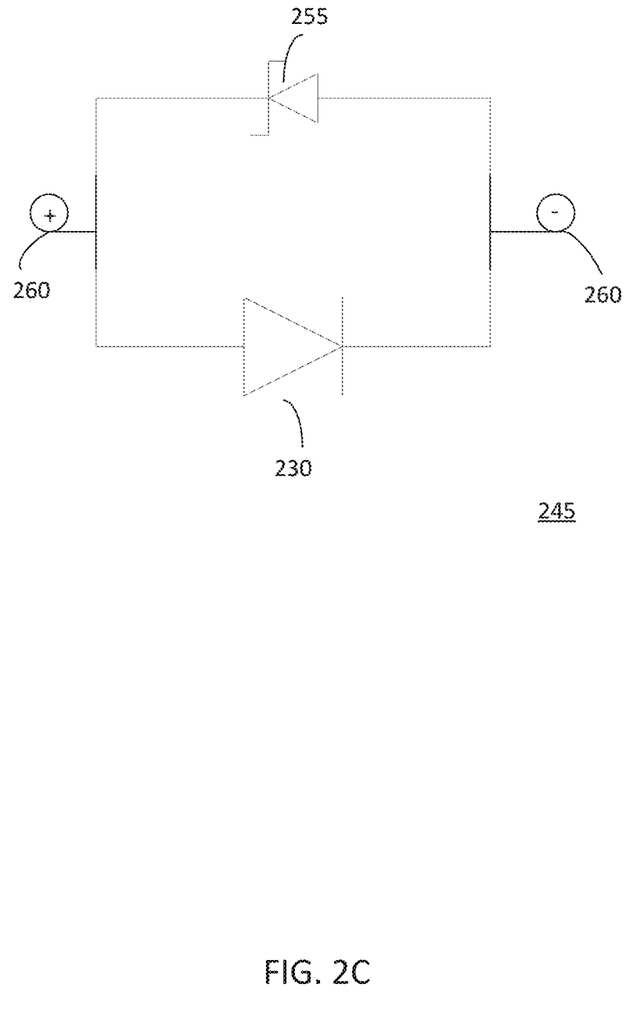
FIG. 2C provides a circuit diagram of an electrostatic discharge protection circuit employed in an LED package according to one embodiment of the present disclose.

Referring back to Zener diode 255, it permits current to flow in a reverse direction when the voltage is above a certain value (i.e., breakdown voltage). The Zener diode 255 protects the LED package 200 by preventing damage to the LED die 230 when the voltage surge exceeds the breakdown voltage. The Zener diode 255 also protects the LED die 230 from electrostatic discharge damages. FIG. 2C illustrates a schematic view of the electrostatic discharge circuit 245 embedded within the resin carrier layer 210.

With regard to FIG. 2B, the RDL 250 provides electrical connections between the light emitting layer 230*b* of LED die 230 and the electrical conductors 260 within the resin carrier layer 210 allows the use of wafer-level processing to fabricate the LED package 200. For example, the RDL 250, phosphor layer 240, and the backside thermal contact 280 are all deposited or applied to the LED package 200 using wafer-level processing methods. These process steps are discussed in more detail with regard to FIGS. 3A-3F below. As previously mentioned, the RDL 250 advantageously extends metal interconnects 250*a* that connect to the contacts 290 on the light emitting layer 230*b*. The wafer level processing methods also include forming the phosphor layer 240 on the LED die 230 using, for example, stencil phosphor printing or phosphor film lamination; these steps are not possible with fragile bond wires on the conventional LED packages.

The structure of LED package 200 provides other advantages as a result of the LED die 230 being substantially embedded within resin carrier layer 210. For example, the amount of silicone in silicone encapsulant or dome 270 can be reduced by up to 30% compared to the amount of silicone needed in conventional silicon dome 180 of FIG. 1. Because the LED die 230 is substantially embedded within the resin carrier layer 210, the top surface of the light emitting layer 230*b* of the LED die 230 may be substantially planar with the first surface of the resin carrier layer 210. With reference to FIG. 1 and FIG. 2A, the distance from the surface of the phosphor layer 120 to silicone dome 180 in a conventional LED package 100 (distance, r, shown in FIG. 1) is greater than the corresponding distance, r', in LED package 200 (shown in FIG. 2A).

In addition, another advantage is increased light extracting efficiency which results from reduced optical absorption by LED die 230. As discussed above with respect to FIG. 1, exposed sidewalls 140*a* compromise the efficiency of the LED package 100 because the exposed sidewalls 140*a* absorb light emitted from the light emitting layer 130. In contrast, the absorptive side walls of LED substrate 230*a* are substantially embedded in the resin carrier layer 210 which minimizes the amount of optical absorption by the LED die 230.

Another advantage is increased performance. As seen in FIG. 2A, the LED substrate 230*a* of the LED die 230 is in direct contact with the thermal contact pad 280 which is in contrast to the conventional LED die 100 shown in FIG. 1. Conventional LED die 100 has a package substrate 110*b*, metal layer 190, and die-attach material (not shown) located between the thermal pad 170*b* and LED substrate 140. The direct contact between the LED substrate 230*a* and the thermal contact pad 280 allows the thermal contact pad 280 to more quickly dissipate the heat of the LED package 200 because of the absence of the additional intervening layers—package substrate 110*b*, metal layer 190, and die-attach material (not shown) found in conventional LED package 100. The above examples are just some of the advantages that the LED package 200 presents over conventional LED packages.

Having discussed the structure of LED package 200, attention will be turned to the fabrication method of for the LED package 200. FIGS. 3A-3F show the various steps of the fabrication method according to one embodiment of the present disclosure.

Figure 3A:
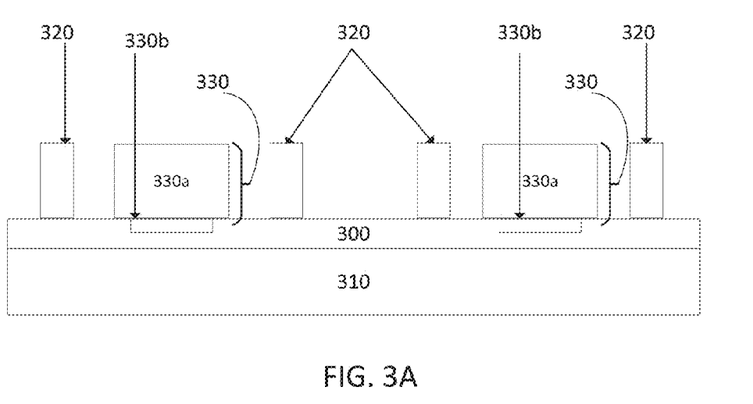
FIGS. 3A-3F provide a cross-sectional view of the steps in the fabrication process according to one embodiment of the present disclosure.

FIG. 3A illustrates the step of placing electrical conductors 320 and LED dies 330 comprising substrates 330*a* and light emitting layers 330*b* onto a thermal release adhesive foil 300 and a carrier 310 using, for example, a pick & place tool. In one embodiment, the carrier 310 may be metallic. The carrier 310 and the thermal release adhesive foil 300 may be formed as a wafer. The thermal release adhesive foil 300 is a double-sided adhesive film. On the side of the thermal release adhesive foil 300 that attaches to the carrier 310, the thermal release adhesive foil 300 is thermally stable. On the side of the thermal release adhesive foil 300 opposing the carrier 310, the thermal release adhesive foil 300 has a thermally sensitive adhesive. A pick & place tool may mount the LED dies 330 and electrical conductors 320 onto the thermal release adhesive foil 300. Zener diodes (not shown) are also placed in this step, which is described further with respect to FIGS. 4A-C.

Figure 3B:
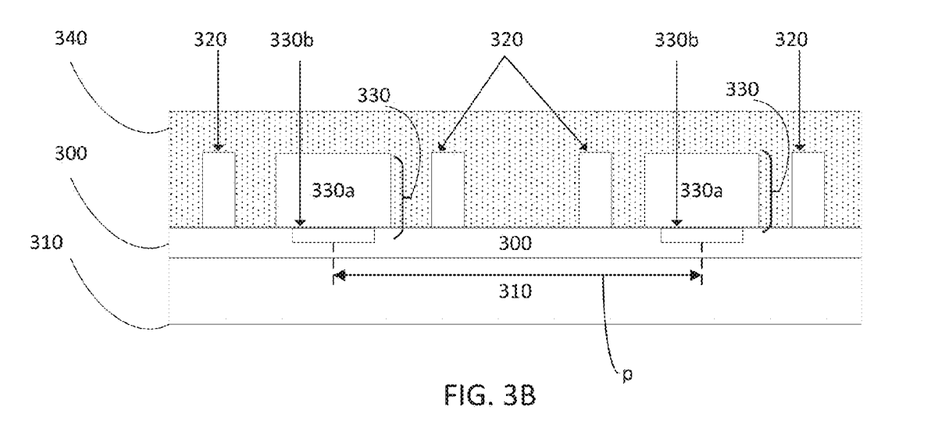

FIG. 3B illustrates the step of applying a resin carrier layer 340 over the placed electrical conductors 320, LED dies 330, and the thermally sensitive adhesive side of the thermal release adhesive foil 300. In one embodiment, the application of the resin carrier layer 340 may comprise using a compression molding process. In this step, the resin carrier layer 340 encapsulates the LED dies 330 and electrical conductors 320 such that the LED dies 330 and electrical conductors 320 are substantially embedded within the resin carrier layer 340. The LED dies 330 and electrical conductors 320 are embedded within the resin carrier layer 340 with a pre-determined pitch p between the LED dies 330. The pitch, p, refers to the distance or separation from the center of each die 330. One of ordinary skill in the art would appreciate the appropriate pitch is based on the size of the LED package to be manufactured.

Figure 3C:
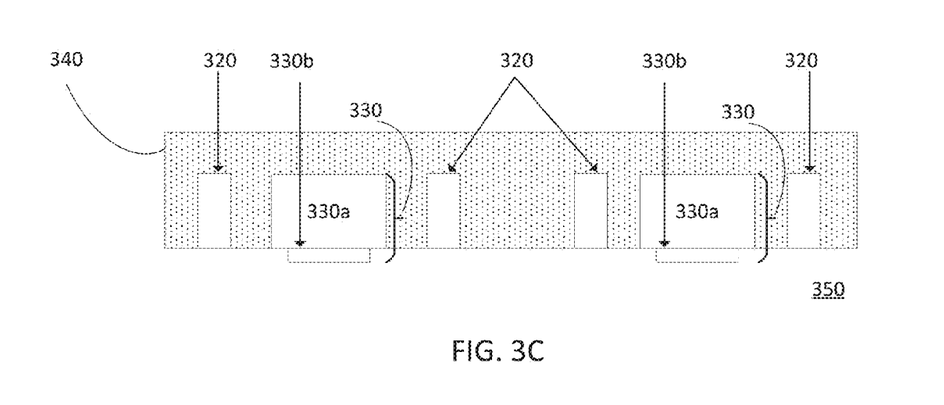

FIG. 3C illustrates the step of removing the thermal release adhesive foil 300 and carrier 310 from one side of the resin carrier layer 340, the LED substrates 330*a*, the light emitting layer 330*b*, and the electrical conductors 320. This step is performed by heating the thermal release adhesive foil 300 which causes the thermally sensitive adhesive side of the thermal release adhesive foil 300 to release from the resin carrier layer 340, the light emitting layer 330*b*, the LED substrates 330*a*, and electrical conductors 320. With the carrier 310 and thermal release adhesive foil 300 removed, portions of the top surfaces of the resin carrier layer 340 and LED substrates 330*a* are exposed and the entire top surface of the light emitting layer 330*b* is exposed. The light emitting layer 330*b* is exposed at the first surface of the resin carrier layer 340. The resin carrier layer 340, with the LED substrates 330*a* and light emitting layer 330*b*, and the electrical conductors 320 substantially embedded within, forms a wafer 350 which allows for subsequent steps to be performed using wafer-level processing.

Figure 3D:
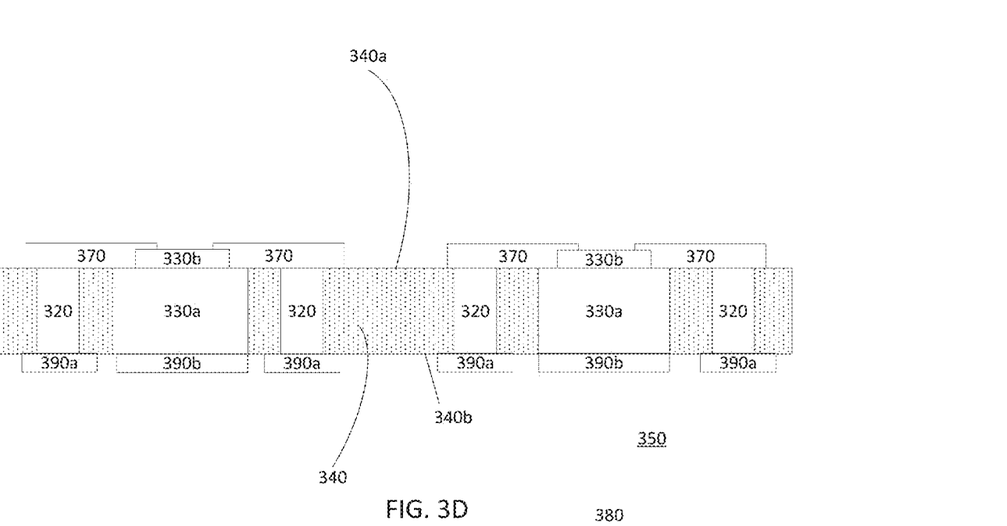

FIG. 3D illustrates the step of performing wafer-level processing on wafer 350. As previously discussed, in contrast to conventional LED package fabrication methods, wafer-level processing is possible because of the absence of fragile bond wires and the presence of a substantially planar surface on the first surface 340*a* of the wafer 350. Excess resin on the bottom surface of the wafer 350 is ground away to expose the second surface 340*b* of the resin carrier layer 340, the bottom surfaces of LED substrates 330*a*, and the bottom surfaces of electrical conductors 320. Redistribution layers 370 are then deposited on the first surface 340*a* of the wafer 350. This deposition step may include depositing the redistribution layers 370 over the top surfaces of electrical conductors 320*a* and portions of light emitting layers 330*b*.

Additionally, backside contact pads 390*a* and 390*b* are formed by either deposition or electroplating process on the second surface 340*b* of the wafer 350. This formation step may include forming the backside contact pads 390*a* and 390*b* over the bottom surfaces of the electrical conductors 320 and the LED substrates 330*a*. Backside contact pads 390*b* may be thermal contact pads. Backside contact pads 390*a* may be electrical pads. Backside contact pads 390*b* are connected to the exposed bottom surfaces of LED substrates 330a and backside contact pads 390a are connected to the exposed bottom surfaces of electrical conductors 320.

Figure 3E:
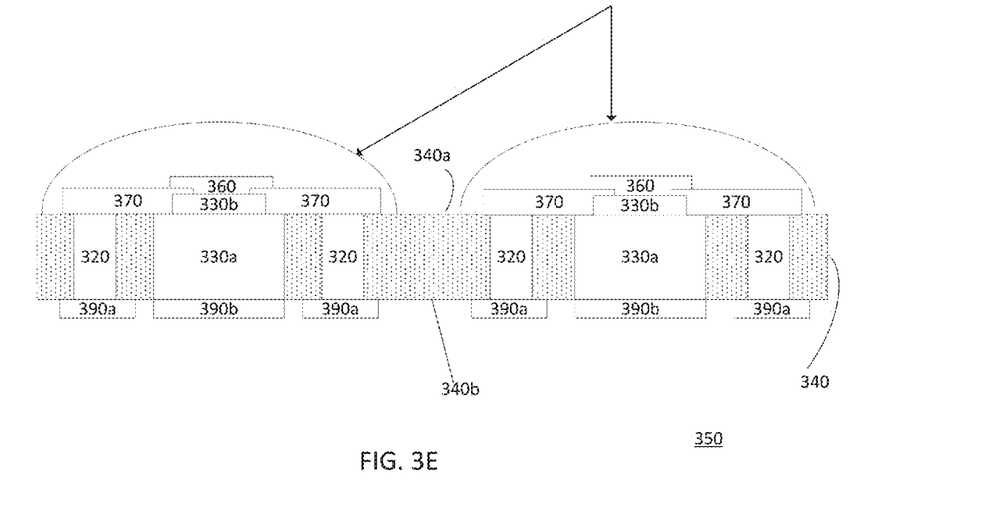

FIG. 3E illustrates the step of forming wafer-level phosphor layers 360 and silicone domes 380 on the first surface 340a of the wafer 350. In contrast to conventional LED package fabrication methods, the phosphor layers 360 can be applied on the light emitting layers 330b as part of a wafer-level processing function, for example, stencil printing or phosphor film lamination. The silicone domes 380 may be formed by compression molding process after the formation of the phosphor layers 360.

Figure 3F:
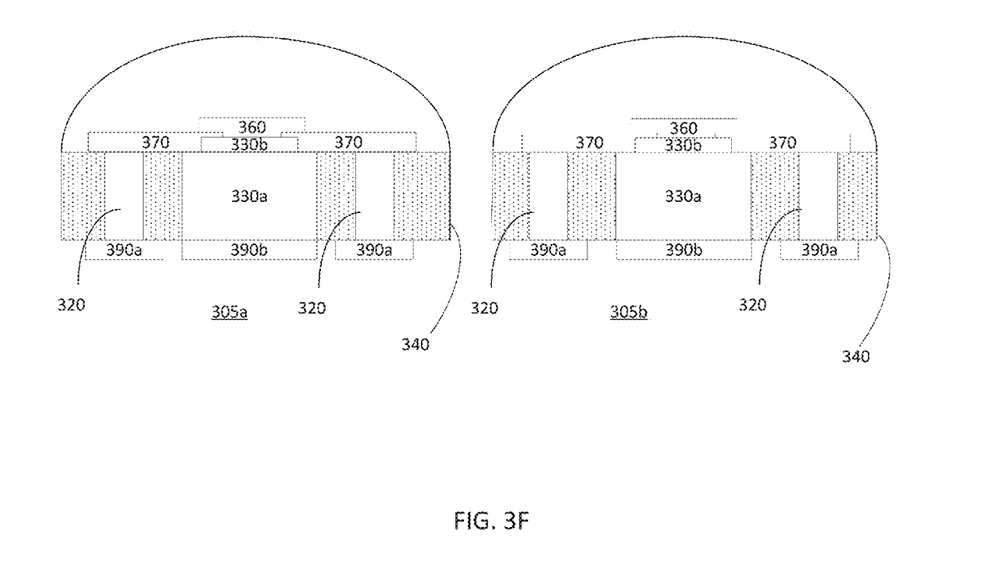

FIG. 3F shows the step of forming the final LED packages 305a and 305b by dicing the wafer 350.

Figure 4A:
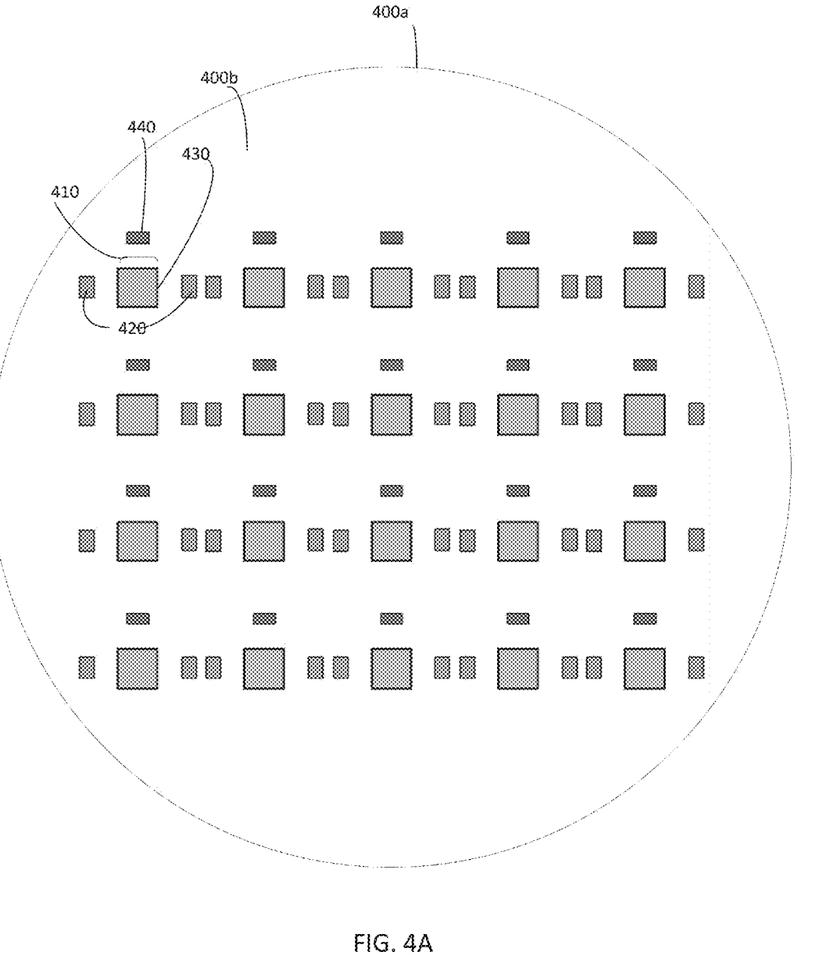
FIG. 4A provides a plan view of the step shown in FIG. 3A.
Figure 4B:
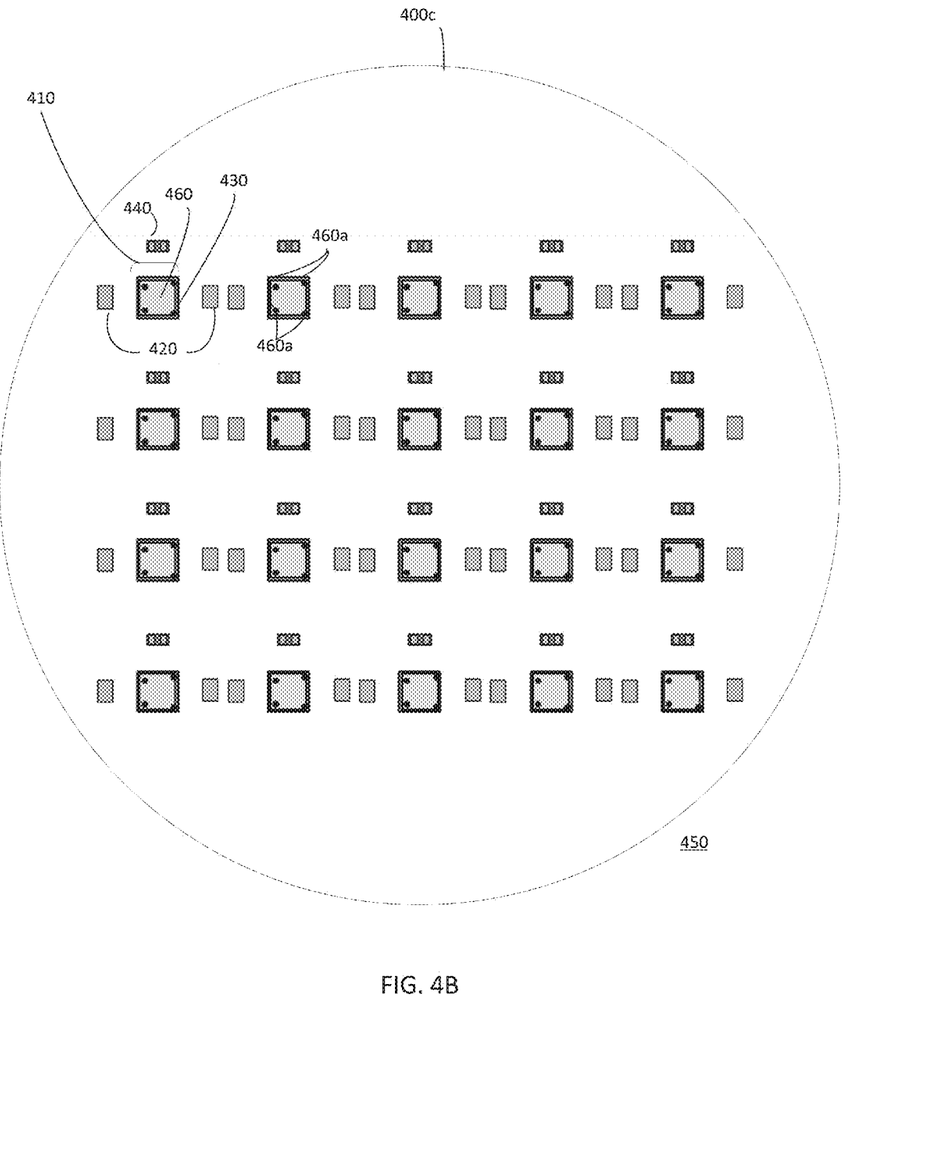
FIG. 4B provides a plan view of the step shown in FIG. 3C.
Figure 4C:
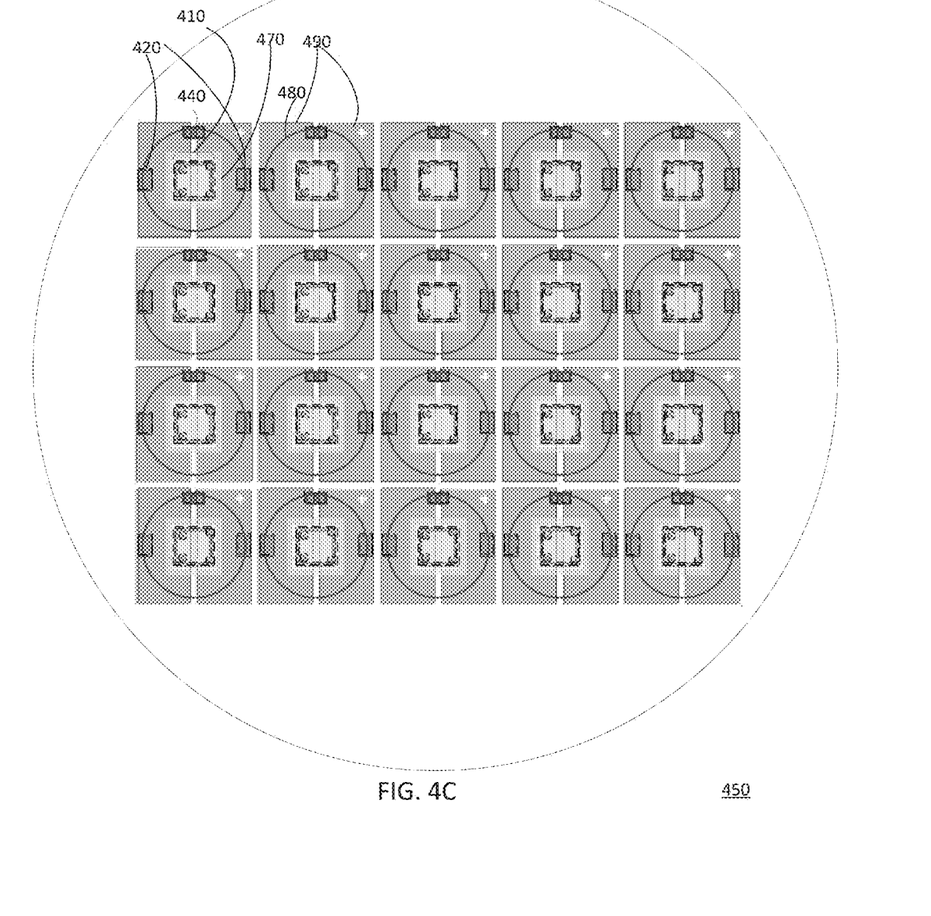
FIG. 4C provides a plan view of the step shown in FIG. 3E.

FIGS. 4A-4C show a plan view of the steps performed in FIGS. 3A, 3C, and 3E, respectively. The wafers shown in FIGS. 4A-4C are merely exemplary and are not shown to scale. The components in FIGS. 4A-4C may be exaggerated for illustrative purposes only and other configurations for the components and wafers are possible. For purposes of clarity, only a certain number of LED packages are labelled and discussed but the following discussion is applicable to all packages located on the wafer 400.

FIG. 4A shows a plan view of the bottom side of wafer 400 after pick-and-place step is performed. In this step, the wafer 400 comprises a metal carrier 400a and double-sided thermal release adhesive foil 400b. There are multiple LED dies 410 and electrical conductors 420 located on the thermally sensitive adhesive of the thermal release adhesive foil 400b of the metal carrier 400a. The view in FIG. 4A shows the bottom side of LED dies 410, electrical conductors 420, LED substrates 430, and Zener diodes 440 because they are all placed with their top surfaces face down onto the thermally sensitive adhesive of the thermal release adhesive foil 400b of the metal carrier 400a.

FIG. 4B illustrates a plan view of the top side of wafer 450 which differs from wafer 400 (shown in FIG. 4A) by being formed of the resin carrier layer 400c, which may for example, comprise an epoxy molding compound. In this view, the metal carrier 400a and adhesive foil 400b have been removed. FIG. 4B further illustrates a top side view of a plurality of substrates 430 and electrical conductors 420, with light emitting layers 460 formed on the substrates 430. The light emitting layers 460 comprise contact pads 460a. Also visible in this view are Zener diodes 440 which are located on the top surface of substrates 430.

FIG. 4C shows a plan view of the top side of wafer 450 after formation of the redistribution layers 490, phosphorous layers 470 and silicone domes 480. The redistribution layers 490 and phosphor layers 470 are deposited above each LED die 410 and conductors 420. The silicone dome 480 is then formed to encapsulate the LED die 410.

Figure 5:
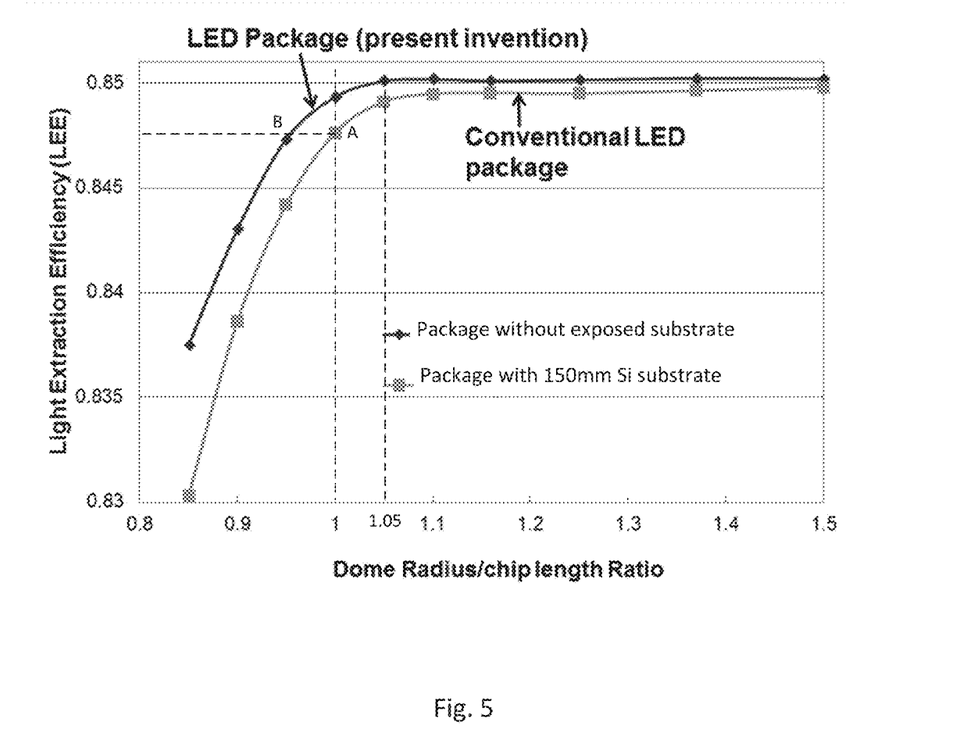
FIG. 5 provides a graph showing the light extraction efficiency of an LED package according to one embodiment of the present disclosure as compared to a conventional LED package.

The process steps described in FIGS. 3A-3F and 4A-4C result in a novel LED package. Said LED package is more efficient in light emission than conventional LED packages. FIG. 5 shows a graph showing the relationship between the light extraction efficiency and the ratio between the silicone dome radius and the chip length. Light extraction efficiency is a measure of how much light is emitted from the light emitting layer and actually escapes the LED package. As discussed above, conventional LED packages have LED chips with exposed absorptive substrate sidewalls because they are die-attached to the package substrate (as opposed to being embedded within a resin carrier layer as described above in the present disclosure). The exposed absorptive substrate sidewall comprises the light extraction efficiency of a conventional LED package because the exposed sidewalls absorb light that is emitted from the light emitting layer. This is particularly true as the size of the silicone dome decreases because the decreased seize reduces the amount of space underneath the silicone dome which increases the possibility that light emitted from the light emitting layer will be reflected back and absorbed by the exposed sidewall of the absorptive substrate. In contrast, the LED package of the present disclosure does not have any exposed sidewalls and therefore can retain its light extraction efficiency even with a reduced silicone dome size.

This improvement in performance is shown in FIG. 5. The light extraction efficiency (LEE) is represented on the y-axis and the ratio of the dome radius to the LED chip length is represented on the x-axis. A ratio of 1.0, for example, means that the dome radius is equal to the length of the LED chip. A typical LED chip is square shaped. As shown in the graph, the conventional LED chip requires a larger ratio between the dome radius and chip length in order to maintain the same light extraction efficiency as the LED package of the present disclosure.

The graph illustrates that the LED package of the present disclosure is more efficient at extracting light from the light emitting layer. For example, with a dome radius to chip length ratio of 1, a conventional LED package has a light extraction efficiency shown at point A on the graph. In contrast, a lower dome to chip length ratio (as represented at point B) is sufficient to achieve the same light extraction efficiency for an LED package of the present disclosure. This lower ratio results in a smaller dome and therefore less silicone being needed to achieve the same efficiency as conventional LED package. Moreover, the LED package of the present disclosure achieves a light extraction efficiency ("LEE") of up to 85% for a dome radius to chip length ratio of 1.05 to 1.5 based on simulation. As can be seen from FIG. 5, the conventional LED package will not achieve such LEE relative to the dome to chip length ratio.

Other objects, advantages and embodiments of the various aspects of the present disclosure will be apparent to those who are skilled in the field of the invention and are within the scope of the description and the accompanying Figures. For example, but without limitation, structural or functional elements might be rearranged consistent with the present disclosure. Similarly, principles according to the present invention could be applied to other examples, which, even if not specifically described here in detail, would nevertheless be within the scope of the present invention.

What is claimed is:

1. A light-emitting diode package, comprising:
   a resin carrier layer having a first surface and a second surface;
   at least one electrical conductor embedded in the resin carrier layer;
   at least one light-emitting diode embedded in the resin carrier layer, the light-emitting diode further comprising:
      a substrate having a bottom surface that is substantially exposed at the second surface of the resin carrier layer, and
      a light emitting layer having a top surface that is substantially exposed at the first surface of the resin carrier layer.

2. The light-emitting diode package of claim 1, wherein a bottom surface of the at least one embedded electrical conductor is exposed at the second surface of the resin carrier layer and a top surface of the at least one embedded electrical conductor is exposed at the first surface of the resin carrier layer.

3. The light-emitting diode package of claim 2, wherein the second surface of the resin carrier layer further comprises a plurality of metal pads formed on the second surface of the resin carrier layer and wherein at least one of the plurality of metal pads is an electrical contact directly connected to the bottom surface of the at least one embedded electrical conductor and at least one of the plurality of metal pads is a thermal contact that is directly connected to the bottom surface of the substrate.

4. The light-emitting diode package of claim 1, further comprising:
   an electrostatic discharge (ESD) protection diode embedded in the resin carrier layer; and
   a redistribution layer formed on the first surface of the resin carrier layer and electrically connecting the at least one light-emitting diode, the ESD protection diode, and the at least one electrical conductor, wherein the redistribution layer comprises a plurality of metal interconnects.

5. The light-emitting diode package of claim 1, wherein the resin carrier layer comprises an epoxy molding compound.

6. The light-emitting diode package of claim 1, wherein the electrical conductor comprises a metal or a semiconductor.

7. The light-emitting diode package of claim 1, wherein the substrate is substantially planar with the first surface of the resin carrier layer.

8. The light-emitting diode package of claim 7, wherein a thickness of the substrate is substantially similar to a thickness of the resin carrier layer.

9. The light-emitting diode package of claim 1, wherein at least fifty percent of the substrate is embedded within the resin carrier layer.

10. The light-emitting diode package of claim 1, wherein at least fifty percent of sidewalls of the light-emitting diode are embedded in the resin carrier layer.

11. The light-emitting diode package of claim 1, wherein the first surface of the resin carrier layer further comprises a phosphor coating formed on the top surface of the at least one light-emitting layer.

12. The light-emitting diode package of claim 1, wherein the first surface of the resin carrier layer further comprises a silicone encapsulant on the top surface of the at least one light-emitting layer.

* * * * *